United States Patent
Schmelzer et al.

(10) Patent No.: US 8,654,805 B2
(45) Date of Patent: Feb. 18, 2014

(54) APPARATUS AND METHOD FOR BALANCING COMBINED RF POWER-SUPPLIES FOR DRIVING A $CO_2$ GAS-DISCHARGE LASER

(75) Inventors: David P. Schmelzer, West Hartford, CT (US); Frederick W. Hauer, Windsor, CT (US)

(73) Assignee: Coherent, Inc., Santa Clara, CA (US)

( * ) Notice: Subject to any disclaimer, the term of this patent is extended or adjusted under 35 U.S.C. 154(b) by 259 days.

(21) Appl. No.: 13/216,091

(22) Filed: Aug. 23, 2011

(65) Prior Publication Data

US 2013/0051416 A1   Feb. 28, 2013

(51) Int. Cl.
 *H01S 3/09* (2006.01)
 *H01S 3/097* (2006.01)
(52) U.S. Cl.
 USPC ..................................... 372/38.07; 372/38.02
(58) Field of Classification Search
 USPC ............................................ 372/38.02, 38.07
 See application file for complete search history.

(56) References Cited

U.S. PATENT DOCUMENTS

| | | |
|---|---|---|
| 7,540,779 B2 | 6/2009 | Papanide et al. |
| 7,605,673 B2 | 10/2009 | Robotham, Jr. et al. |
| 7,755,452 B2 | 7/2010 | Knickerbocker et al. |
| 7,885,308 B2 | 2/2011 | Robotham, Jr. et al. |
| 7,944,305 B2 | 5/2011 | Knickerbocker et al. |
| 7,970,037 B2 | 6/2011 | Hauer et al. |
| 2007/0031156 A1 | 2/2007 | Robotham |

OTHER PUBLICATIONS

Hauer et al., U.S. Appl. No. 12/786,199, filed May 24, 2010, titled "Impedance-Matching Transformers for RF Driven CO2 Gas Discharge Lasers", 23 pages.
Hauer et al., U.S. Appl. No. 13/029,953, filed Feb. 17, 2011, titled "Impedance-Matching Circuits for Multi-Output Power Supplies Driving C02 Gas-Discharge Lasers", 35 pages.
International Search Report and Written Opinion received for PCT Patent Application No. PCT/US2012/051467, mailed on Nov. 15, 2012, 11 pages.

*Primary Examiner* — Tod T Van Roy
*Assistant Examiner* — Michael Carter
(74) *Attorney, Agent, or Firm* — Morrison & Foerster LLP

(57) ABSTRACT

Radio-frequency (RF) power supply apparatus for supplying RF power to discharge electrodes of a gas-discharge laser includes a plurality of amplifier modules each having an RF output. A power combining arrangement is provided for combining the amplifier module RF-outputs into a single combined RF-output connected to the discharge electrodes. A DC power supply is connectable to or disconnectable from each of the transistor amplifier modules, separately, to allow current drawn by any of the amplifier modules to be monitored by a single current sensor.

20 Claims, 4 Drawing Sheets

APPARATUS AND METHOD FOR BALANCING COMBINED RF POWER-SUPPLIES FOR DRIVING A $CO_2$ GAS-DISCHARGE LASER

TECHNICAL FIELD OF THE INVENTION

The present invention relates in general to carbon dioxide ($CO_2$) gas-discharge lasers. The invention relates in particular to $CO_2$ gas-discharge lasers driven by the combined output of plural RF-transistor power supplies.

DISCUSSION OF BACKGROUND ART

In a $CO_2$ gas-discharge laser a lasing gas mixture within a laser housing is energized by a radio-frequency (RF) discharge in the gas mixture struck between a pair of parallel spaced-apart electrodes. In a high power $CO_2$ laser, for example, a $CO_2$ slab-laser having an output power of 100 Watts (W) or more, the gas mixture typically includes $CO_2$, nitrogen ($N_2$) and helium He, and is at a pressure between about 50 and 150 Torr. RF voltage (RF power) for driving the laser (energizing the gas-discharge) is provided by the combined output of a plurality of RF amplifiers which are connected to a single RF oscillator, the output of which is optionally pre-amplified. Typically, each of the amplifiers includes two RF-transistor amplifier modules in a push-pull arrangement.

The RF voltage typically required to excite a gas discharge in a $CO_2$ slab laser is about 225 volts at about 80 to 100 MHz drive frequency. Current in the discharge for a constant voltage V applied to increases linearly with power delivered into the discharge. The impedance of the discharge decreases as the RF power into the discharge is increased. A $CO_2$ slab-laser has an efficiency of about 10% for converting RF power into the discharge to laser output power. By way of example, a $CO_2$ laser having 250 W output requires about 2500 W of RF power at a current of about 11 Amps (A) to be delivered into the discharge. The impedance of the discharge is about 20 Ohms.

By way of example, to in order to provide 2500 W of RF power using transistor power modules a minimum of six MOSFET BLF278 modules available from Philips Corporation of Eindhoven, Holland would be required. Outputs of the modules would need to be combined to form a single output that is provided to electrodes generating the laser gas-discharge.

A problem that needs to be addressed in combining the outputs of multiple transistor power amplifier modules is current balancing and phase adjustment of the outputs of each of the individual amplifiers. This is required in order to obtain maximum power output into a load (the discharge electrodes) with minimum back reflection. This back reflection exhibits itself as heat dissipated within the transistor modules.

FIG. 1 schematically illustrates a prior-art arrangement 10 for current and phase balancing RF power amplifiers in a RF combiner type power supply used in driving a $CO_2$ diffusion cooled lasers. Here, the output of a RF oscillator 12 is provided to the input of a driver amplifier 14. The output of the driver amplifier is provided to the input of a 1 to 3 signal splitter (signal divider) 16. Each of three outputs of the splitter is provided to a corresponding power amplifier stage 18. The amplifier stages are nominally identical but are separately designated as stages 18A, 18B, and 18C to reflect the fact that there may be subtle differences due to manufacturing tolerance in the amplifier stages and components thereof. These differences lead to a requirement for the above-discussed current and phase balancing.

In amplifier stage 18A, the corresponding signal from splitter 16 is further split into two portions by a signal splitter (signal divider) D1. One portion is sent to a transistor amplifier module A1 and the other portion is sent to a transistor amplifier module A2. Amplifier modules A1 and A2 are arranged, here, in a push-pull configuration. The amplifier outputs are combined by an impedance matching network Z1. In amplifier stage 18B, the corresponding signal from splitter 16 is further split into two portions by a signal splitter D2. The portions are amplified by transistor amplifier modules A3 and A4, and the amplified outputs are combined by a impedance matching network Z2. In amplifier stage 18C, the corresponding signal from splitter 16 is further split into two portions by a signal splitter D3. The portions are amplified by transistor amplifier modules A5 and A6, and the amplified outputs are combined by a impedance matching network Z3.

The outputs of impedance matching networks Z1, Z2, and Z3 are combined by a RF Output Power Combiner 20. The combined outputs are applied to live electrode 24 of an electrode pair 22 (discharge electrodes) comprising electrode 24 and a grounded electrode 26, spaced apart and parallel to each other. The electrodes are located within a laser housing (not shown) including the lasing gas mixture. An impedance matching network (IMN) 28 matches the output impedance of combiner 20 with the impedance of the discharge electrodes.

Transistor amplifier modules A1-6 are powered by DC voltage from a DC power supply 30. The DC power supply delivers power to each of the transistor amplifier modules A-6 through one of 6 corresponding current sensors CS1-6 respectively. A preferred current sensor is a Hall-effect sensor. A Hall-effect current sensor produces an output voltage in proportion to the current flowing through it. Such a sensor can handle a wide range of currents from sub-amperes to hundreds of amperes in a package compatible with printed circuit board technology.

Current and phase balancing is accomplished by adjusting selectively variable impedance circuits B1-6 connected to a respective input of transistor amplifier modules A1-6. The circuits here are each in the form of a variable shunt (parallel) capacitance. Adjusting the impedances of circuits B1-6 adjusts the input power and phase of inputs into the transistor amplifier modules A1-6, which in turn varies the amount of DC current drawn by the transistor amplifier modules from DC power supply 30. This, in turn again, varies the output power and the phase of the output of transistor amplifier modules, and, correspondingly, varies the amplitude and phase of the RF outputs of impedance matching networks Z1-3.

The impedances of the variable impedance circuits B1-6 are adjusted until the amplitude and phase of each of the inputs to power combiner 20 are equal or nearly equal. The amplitude and phase can be monitored with the aid of an oscilloscope and temporary connections, as in known in the art. The adjustments are necessary to compensate for variations, within manufacturing tolerances, of components of amplifier stages 18A-C. Having the same current and phase out of the output from the amplifier stages is important for achieving maximum RF power delivery into the gas discharge created by electrode-pair 22.

It should be noted here that only sufficient description of apparatus 10 has been provided for understanding the current and phase balancing of the inputs combined by power combiner 20. Detailed descriptions of RF power combiners, and impedance matching networks for the same, are provided in U.S. Pat. No. 7,755,452 and U.S. Pat. No. 7,970,037, each assigned to the assignee of the present invention, and the complete disclosure of each of which is hereby incorporated herein by reference.

While the above-described current and phase balancing method is perfectly adequate for achieving the desired optimization of power transfer to the discharge electrodes in a finished $CO_2$ laser, the method has certain shortcomings from a manufacturing point-of-view, particularly regarding the time required for, and the corresponding cost, of the balancing operation. This time required is relatively long because there is a cross-talk between the amplifiers which makes the balancing operation an iterative process, with a series of re-adjustments required of each variable impedance circuit to converge on a balance point. Considerable skill and experience is required of an operator to master the iterative process. Another shortcoming is the time and cost required for installation current sensors in each of connections between the transistor amplifier modules and the DC power supply. There is a need for a simpler and less time-consuming method current and phase balancing for combined amplifier outputs.

SUMMARY OF THE INVENTION

In one aspect of the present invention, radio-frequency (RF) power supply apparatus for supplying RF power to discharge electrodes of a gas-discharge laser comprises a first plurality of transistor amplifier modules each thereof having an RF output. A power combining arrangement is provided for combining the transistor amplifier module RF outputs into a single combined RF output connected to the discharge electrodes. A DC power supply is provided for supplying a DC voltage to each of the first plurality of transistor amplifier modules. The DC power supply is connectable to or disconnectable from each of the transistor amplifier modules, separately, via a corresponding first plurality of electrical switches. A first current-sensor is located in an electrical path between the DC power supply and the first plurality of electrical switches for monitoring current drawn by any one of the first plurality of transistor amplifier modules when that transistor amplifier module is connected to the DC power supply.

In a preferred embodiment of the invention there is a second plurality of transistor amplifier modules, each thereof having an RF output, with the RF outputs of the second plurality of transistor modules combined into the single combined RF output by the power combining arrangement. Each of the second plurality of transistor amplifier modules being connectable to or disconnectable from the DC power supply by a corresponding second plurality of electrical switches. A second current-sensor is located in an electrical path between the DC power supply and the second plurality of electrical switches for monitoring current drawn by any one of the second plurality of transistor amplifier modules when that transistor amplifier module is connected to the DC power supply.

The inventive circuit arrangement allows for current and phase balancing in the power combining arrangement with only a pair of the transistor amplifier modules connected to the power supply at any one time, while being monitored by the two current sensors. This avoids the above discussed cross-talk problem between plural pairs of sensors in prior-art apparatus while saving cost by reducing the total number of sensors required to two, regardless of the number of transistor amplifier module pairs.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain principles of the present invention.

DETAILED DESCRIPTION OF THE INVENTION

Figure 1:
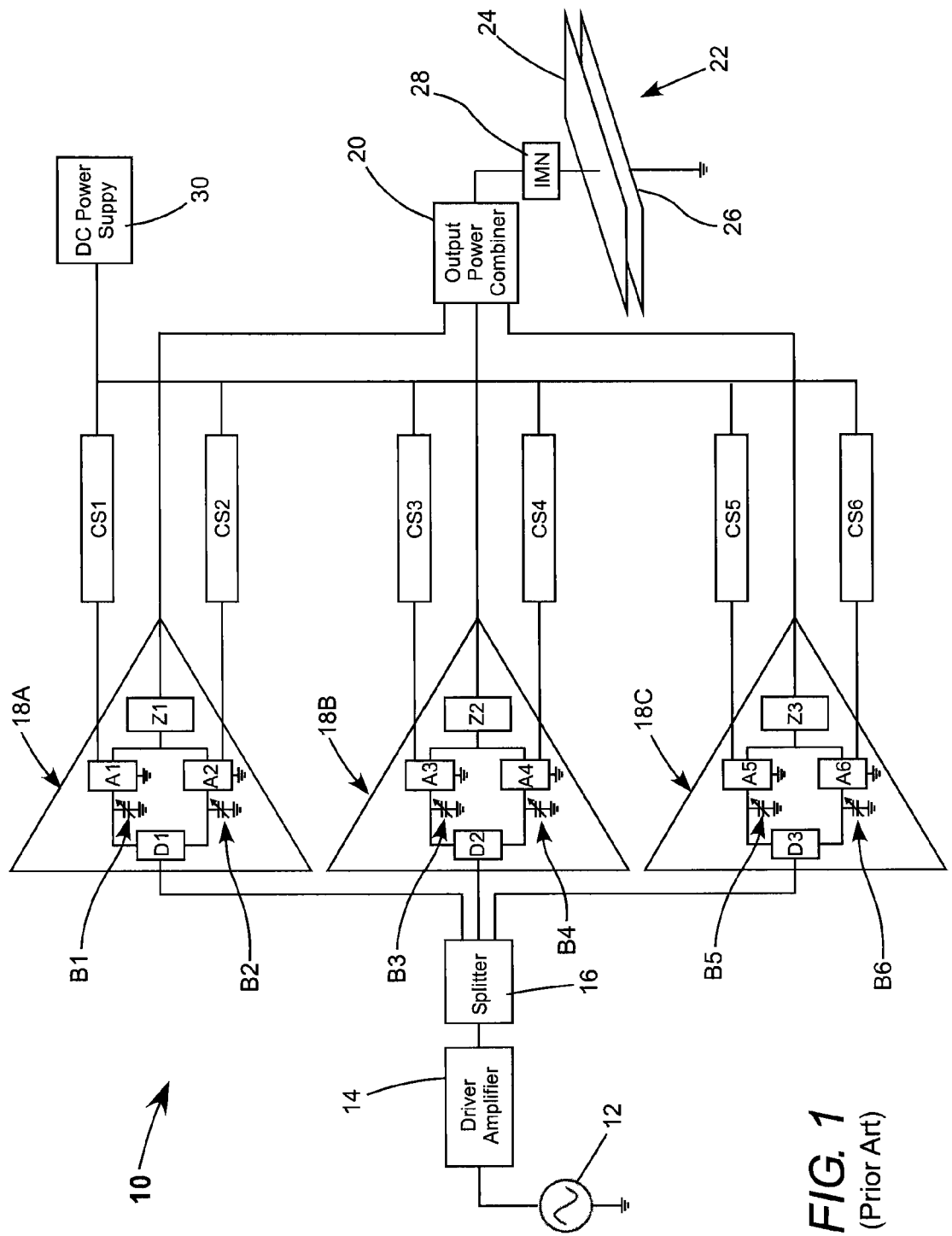
FIG. 1 schematically illustrates a prior-art circuit in which the RF output of three amplifier stages is combined, each amplifier stage including two transistor amplifiers in a push-pull configuration the transistor amplifiers being powered by DC current delivered from a single power supply through six corresponding current sensors, with six selectively variable impedance circuits being provided for adjusting inputs to the transistor amplifiers for balancing the amplitude and phase of outputs of the amplifier stages prior to combining.
Figure 2:
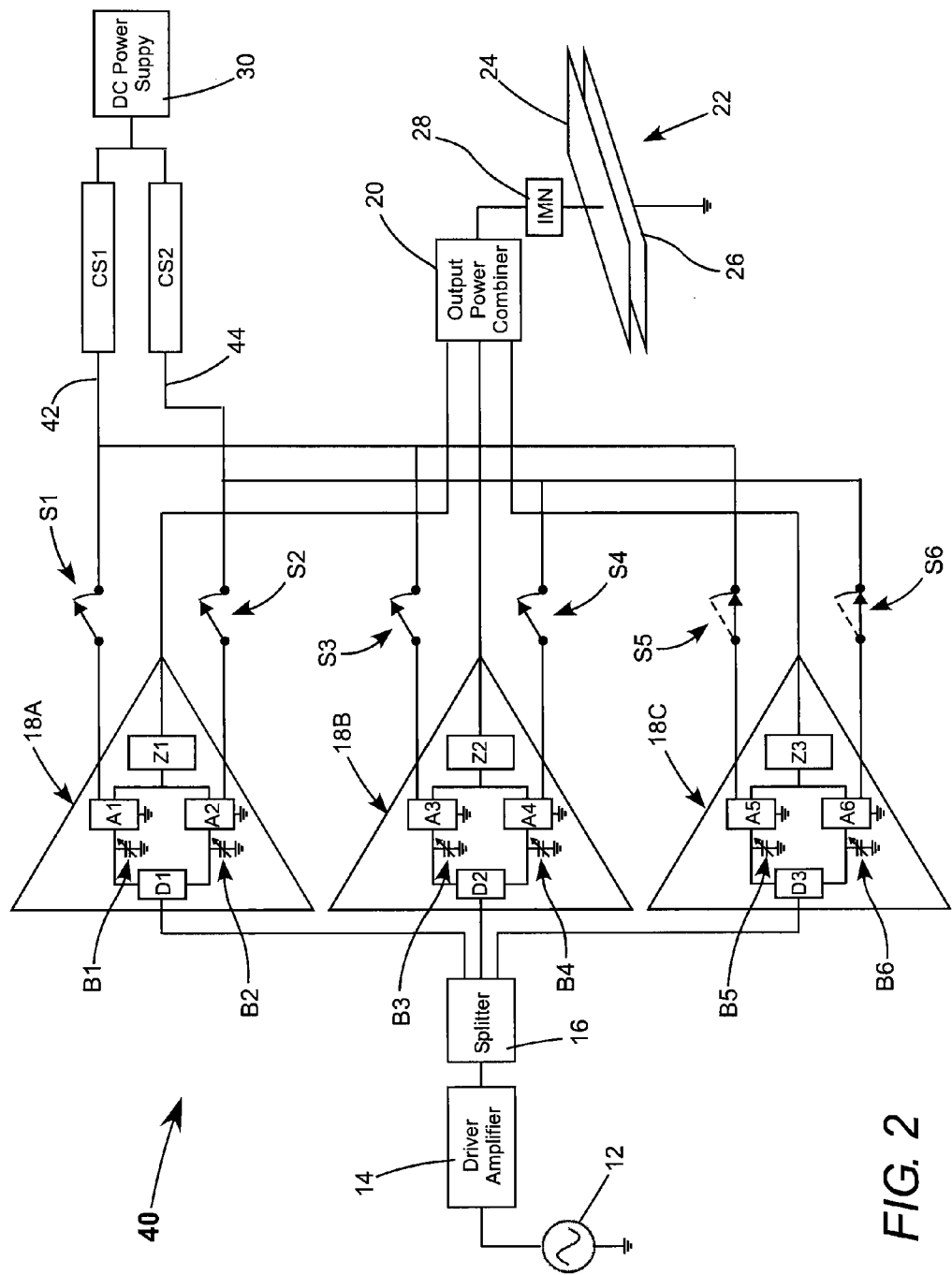
FIG. 2 schematically illustrates one preferred embodiment of a circuit in accordance with the present invention in which the RF output of three amplifier stages is combined, similar to the circuit of FIG. 1, but wherein there are only two current sensors arranged to be separately connectable to each of the amplifier stages during the amplitude and phase balancing operation.

Continuing with reference to the drawings, wherein like features are designated by like reference numerals, FIG. 2 schematically illustrates one preferred embodiment 40 of a circuit in accordance with the present invention in which the RF output of three amplifier stages is combined. Circuit 40 is similar to circuit 10 of FIG. 1 with exceptions as follows. In circuit 40 there are only two current sensors CS1 and CS2 in two connections 42 and 44 to DC power supply 20. Suitable current sensors are Hall-effect current sensors, such as model number AE5758 manufactured by Allegro MicroSystems Inc., of Irvine, Calif. Connections 42 and 44 are connectable, via switches S1, S2, S3, S4, S5 and S6, to all of the amplifier stages 18A-C. One of the connections is made (via the appropriate switch) to one of the transistor amplifier modules in the amplifier stage and the other connection (via the appropriate switch) to the other of the transistor amplifier modules in the amplifier stage.

In actual operation by a user, all of switches S1-6 are closed, such that all three amplifier stages are powered. In a current and phase balancing operation, only one amplifier can be connected to the power supply at a time. In FIG. 2, amplifier stage 18C is depicted as being connected to the power supply with switches S5 and 6 closed, while amplifier stages 18A and 18B are disconnected from the power supply by opening switches S1 and S2, and switches S3 and S4. As each of the amplifier stages include two amplifier modules in a push-pull configuration, both switches associated with an amplifier stage must be closed in order for the amplifier stage to operate.

As in the circuit of FIG. 1, selectively variable impedance circuits B1-6, here in the form of a shunt capacitor, are provided for adjusting inputs to transistor amplifier modules A1-6 respectively for the balancing inputs to power combiner. For the Philips NXP BLF278 (MOSFET) amplifier modules referenced above, the shunt capacitors preferably have a value between about 3 and 15 picofarads (pF). The NXP BLF278 MOSFET is rated up to 400 W of continuous output power at 100 MHz. This transistor module requires 48 volts DC from power supply 30. Using this MOSFET, for all amplifier modules A1-6, the output of power combiner 20 could be up to 2400 W, which is sufficient RF power to drive a laser having 240 W output.

Connections to amplifier stage 18A-C are depicted and described as being makeable or breakable by mechanically operated switches S1-S6 for clarity of description. It has been found in practice, however, to be more convenient and less costly to substitute removable links or fuses for the switching operation, with a fuse (link) being removed to open a connection and replaced to close a connection. The term "switch", as used in this description and the appended claims, is intended to include such removable links or fuses. For the power levels exemplified above, these removable links can be typically low cost and low height-profile mini-fuses, such as LITTEL-FUSE, part number 0891, with a low-profile fuse-socket, such as model 3557-2 both available from Keystone Electronic Corporation, of Astoria, N.Y.

In one example of a current and balancing operation in the circuit of FIG. 2, a computer simulation of the circuit, using a commercially available circuit analysis software, such as PSPICE available from Cadence Design Systems Inc, of San Jose, Calif., is conducted to establish nominal values (based on nominal component specifications for amplifier stages 18A-C), for the variable impedance circuits B1-6. Then, switches S3-6 are opened leaving S1 and S2 closed, such that only amplifier stage 18A is connected to DC power supply 30. In an iterative, or trial and error, manner, the impedance (reactance) values of circuits B1 and B2 are varied until equal currents (measured by current sensors CS1 and CS2) are being drawn by transistor amplifier modules A1 and A2. The phase of the output RF signals from A1 and A2 is also observed. If the outputs are not in phase, the phases are equalized by re-adjusting the reactance values of circuits B1 and B2 around the nominal values calculated by the software simulation. This will usually disturb the previously established current-balance. Fine adjustment of the reactance of circuits B1 and B2 is continued iteratively until an optimum balance of current and phase has been established.

Next, switches S1 and S2 are opened to disconnect amplifier stage 18A from the power supply, and switches S3 and S4 are closed to connect amplifier stage 18B to the DC power supply (via the current sensors). Then the reactance of circuits B3 and B4 is adjusted to balance the currents being drawn by amplifier modules A3 and A4 and the phase of the amplifier module outputs as performed for amplifier stage 18A. The currents of amplifier 18 A and amplifier 18B are compared. The currents should be equal such that the RF power fed into the output power combiner by amplifier stage 18B matches that from stage 18A. If the currents are not equal, iterative adjustments of the reactance of circuits B1 and B2, and B3 and B4 (with only one amplifier stage at a time connected to the power supply) until an acceptable phase and current balance has been established for the four amplifier currents and the amplitude and phase of inputs to power combiner 20.

Once this acceptable balance has been achieved, switches S1, S2, S3, and S4 are opened to disconnect amplifier stages 18A and 18B from the DC power supply and switches S5 and S6 are closed to connect amplifier stage 18C to the DC power supply. An iterative process as described above is carried out, with readjustment if necessary to circuits B1, and B2, and B3 and B4, until an acceptable balance has been established for currents drawn by the amplifier stages, and for the phases of inputs to power combiner 20.

Once the acceptable balance has been achieved with each of the amplifier stages 18A-C adjusted individually, all of switches S1-6 are closed to connect all three amplifier stages to the DC power supply. The RF power output and phase from stages 18A-C is measured at the inputs to the RF power combiner. If the powers and phases are equal within a specified tolerance, then current and phase balancing is completed. If either current or phase balancing falls without the specified tolerances, the balancing can be further adjusted as described above. Further fine-tuning could be achieved by adjusting component values in one or more of impedance matching circuits Z1-3. As laborious a task as this may seem from the description provided above, it has been found to be significantly less time-consuming than the current and phase balancing process in the prior-art apparatus of FIG. 1, wherein cross-talk between the amplifier stages complicates the iterative balancing procedure.

It should be noted here that while variable impedance (variable reactance) circuits B1-6 are each depicted as a shunt-connected (parallel-connected) selectively variable capacitor, other forms of selectively variable reactance circuit may be used without departing from the spirit and scope of the present invention. These include a series-connected selectively variable capacitor of more complex circuits including capacitive or inductive elements.

Figure 3:
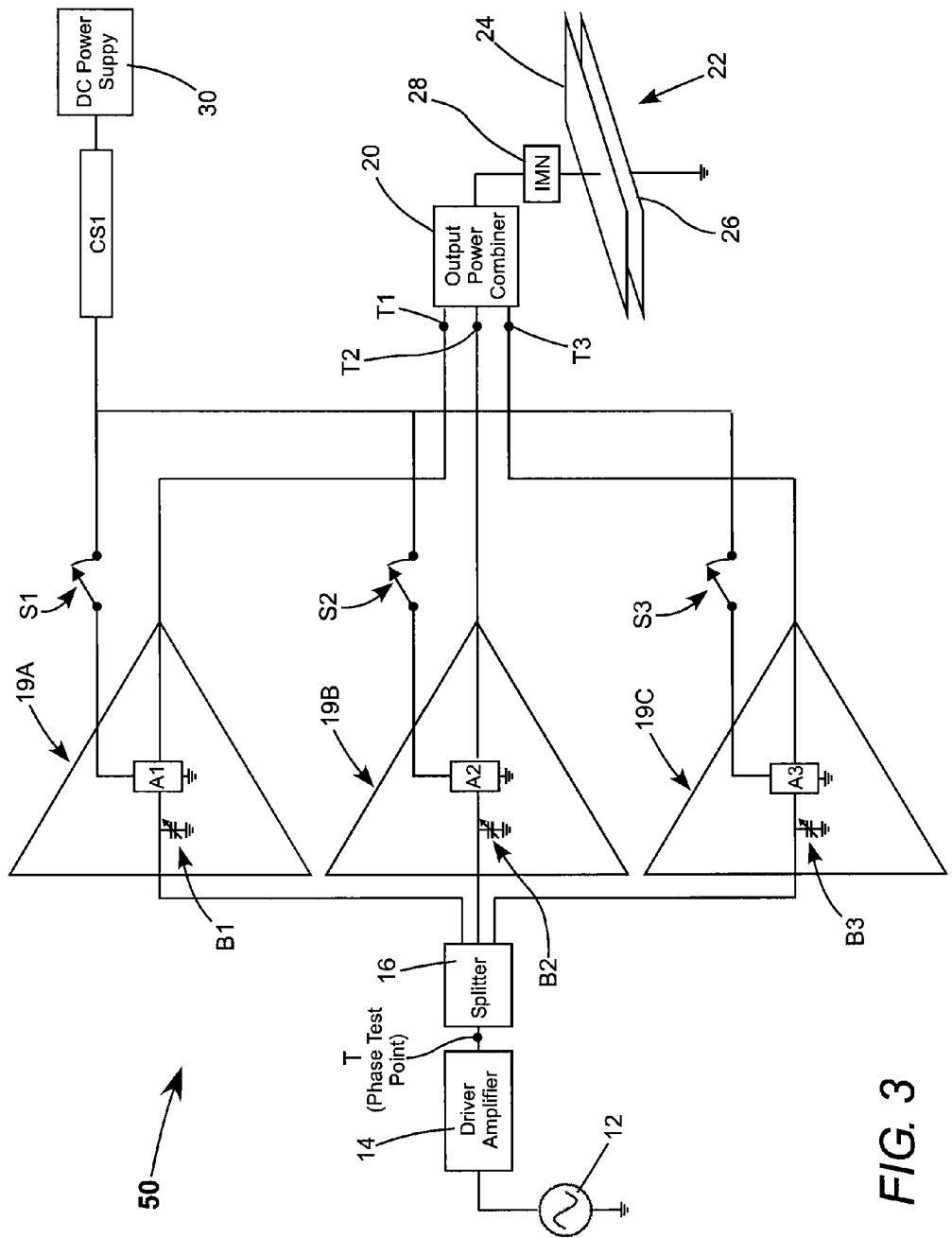
FIG. 3 schematically illustrates another preferred embodiment of a circuit in accordance with the present invention in which the RF output of three amplifier stages is combined, similar to the circuit of FIG. 2, but wherein the amplifier stages each include only one transistor module, there are only three selectively variable impedance circuits, and there is only one current sensor connected to a DC power supply and arranged to be separately connectable to each of the amplifier stages during the amplitude and phase balancing operation.

FIG. 3 schematically illustrates another preferred embodiment 50 of a circuit in accordance with the present invention, in which the RF output of three amplifier stages 19A, 19B, and 19C is combined. Circuit 50 is similar to circuit 40 of FIG. 2, but in circuit 50, the amplifier stages each include only one transistor amplifier module, with modules designated as modules A1, A2, and A3, respectively. There are only three selectively variable impedance circuits, designated B1, B2, and B3 respectively, and there is only one current sensor CS1 arranged to be separately connectable via switches S1, S2, and S3 respectively to each of the amplifier stages during a current and phase balancing operation.

In one example of a current and balancing operation in the circuit of FIG. 3, a computer simulation of the circuit is conducted to establish nominal values for the variable impedance circuits B1-3, as discussed above with reference to operation of the circuit of FIG. 2. Switch S1 is then closed and switches S2 and S3 are opened. The current drawn from the DC power supply by transistor amplifier module A1 is measured by the current sensor CS1. Shunt reactance B1 is adjusted to operate amplifier A1 in the desired output power range, which is directly proportional to the DC current drawn by the amplifier.

Next the phase at the output of transistor amplifier A1 is measured and compared with the phase of the input signal at a test point T located between the output of driver amplifier 14 and the input to signal splitter 16. This phase comparison can be made, for example, by contacting one lead of a dual trace oscilloscope at test point T and a test point T1 located ahead of output power combiner 20. The phase shift imposed by the amplifier, if any, can be seen by a displacement of two waveforms displayed on the oscilloscope screen. Points T2 and T3 are provided for making similar phase comparisons with amplifiers A2 and A3, respectively.

The above procedure is repeated for the other two amplifiers (separately), adjusting selectively variable capacitors B2 and B3 such that the current drawn by each amplifier A1, A2. and A3 is the same, and phase-shifts indicated by measurement, between test point T and test points T1, T2, and T3 are the same. This completes the current and phase balancing procedure.

Figure 4:
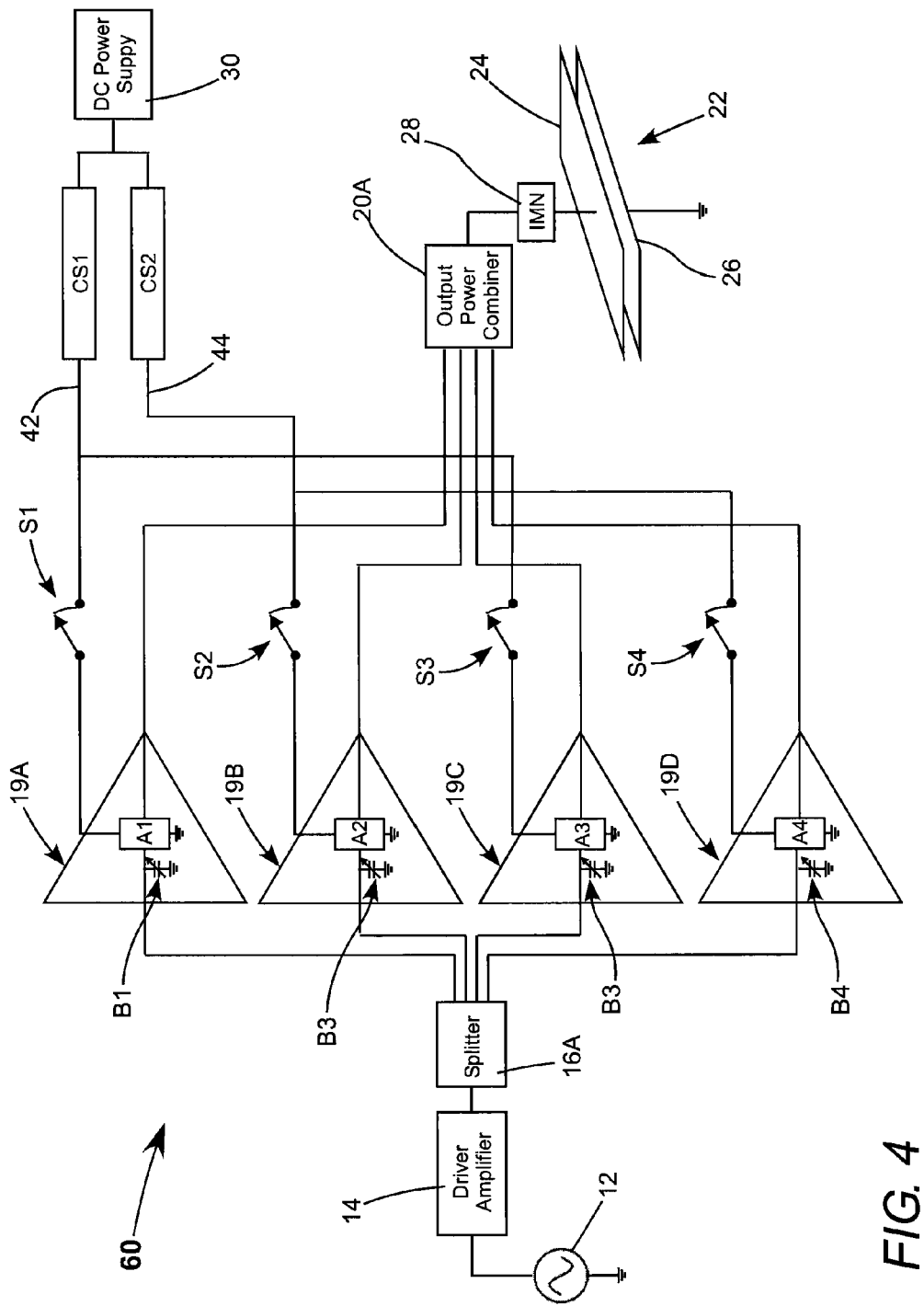
FIG. 4 schematically illustrates yet another preferred embodiment of a circuit in accordance with the present invention in which the RF output of four (two pairs) of amplifier stages is combined, similar to the embodiment of FIG. 3, but wherein there are two (a pair of) current sensors connected to the DC power supply, with each pair separately connectable to an amplifier-stage pair during the amplitude and phase balancing operation.

The general arrangement of FIG. 3 can be extended to include more than three amplifier modules. However, when more than three amplifier stages are needed to provide a desired power into the discharge, an even number of amplifier stages is preferred, arranged as depicted in FIG. 4. Here, a circuit 60 has four amplifier stages 19A, 19B, 19C, and 19D, including transistor amplifier modules A1, A2, A3, and A4 respectively. DC power supply 30 powers transistor amplifier modules A1 and A3 through current sensor CS1. The power supply powers transistor modules A2 and A4 through current sensor CS2.

This arrangement is similar to the arrangement of FIG. 2, with an exception that the transistor amplifier modules are not arranged in a push-pull configuration. A preferred current and phase balancing procedure is essentially that described above with reference to FIG. 2. Amplifier stages 19A and 19B can be balanced first, with switches S1 and S2 closed, and switches S3 and S4 open. Then amplifier stages 19C and 19D can be balanced, with switches S1 and S2 open, and switches S3 and S4 closed.

The present invention is described above with reference to embodiments including an exemplary number of amplifiers and to preferred circuit components. Those skilled in the art will recognize that a greater number of amplifiers may be combined, or different components used, without departing from the spirit and scope of the present invention as defined by the claims appended hereto.

What is claimed is:

1. Radio-frequency (RF) power supply apparatus for supply RF power to discharge electrodes of a gas-discharge laser, comprising:
    a first plurality of transistor amplifier modules each thereof having an RF output;
    a power combining arrangement for combining the transistor amplifier module RF outputs into a single combined RF output connected to the discharge electrodes;
    a DC power supply for supplying a DC voltage to each of the first plurality of transistor amplifier modules, the DC power supply being connectable to or disconnectable from each of the transistor amplifier modules, separately, via a corresponding first plurality of electrical switches; and
    a first current-sensor located in an electrical path between the DC power supply and the first plurality of electrical switches for monitoring current drawn by any one of the first plurality of transistor amplifier modules when that transistor amplifier module is connected to the DC power supply.

2. The apparatus of claim 1, further including a second plurality of transistor amplifier modules, each thereof having an RF output, with the RF outputs of the second plurality of transistor modules combined into the single combined RF output by the power combining arrangement, each of the second plurality of transistor amplifier modules being connectable to or disconnectable from the DC power supply by a corresponding second plurality of electrical switches; and a second current-sensor located in an electrical path between the DC power supply and the second plurality of electrical switches for monitoring current drawn by any one of the second plurality of transistor amplifier modules when that transistor amplifier module is connected to the DC power supply.

3. The apparatus of claim 2, wherein there is an equal number N of transistor amplifier modules in each of the first and second pluralities thereof.

4. The apparatus of claim 3 wherein there are N RF-amplifier stages each thereof including only one of the first plurality of transistor amplifier modules and only one of the second plurality of transistor amplifier modules arranged in a push-pull configuration.

5. The apparatus of claim 4 wherein the power combining arrangement includes N impedance matching networks one thereof in each of the amplifier stages for combining the RF outputs of the transistor amplifier modules into a N RF amplifier-stage outputs and a single RF power combiner for combing the N RF-amplifier stage outputs into the single RF output connected to the discharge electrodes.

6. The apparatus of claim 3, wherein there are 2N amplifier stages each thereof including only one of the first and second pluralities of transistor amplifier modules.

7. The apparatus of claim 6, wherein the power combining arrangement includes a single RF power combiner for combining the transistor amplifier modules RF outputs into the single RF output connected to the discharge electrodes.

8. The apparatus of claim 3, wherein an RF signal to be amplified is divided into 2N portions by a signal divider, the 2N signal portions connected by a corresponding one of 2N input connections to a corresponding one of the 2N transistor amplifier modules, and wherein there are 2N selectively variable reactance circuits, one thereof connected to a corresponding one of each of the 2N input connections for adjusting the amplitude and phase of the corresponding signal portion connected to the corresponding transistor amplifier module.

9. The apparatus of claim 8, wherein each of the selectively variable reactance circuits includes a parallel-connected selectively variable capacitor.

10. The apparatus of claim 1, wherein the combined RF output is connected to the discharge electrodes via an impedance matching network.

11. Radio-frequency (RF) power supply apparatus for supply RF power to discharge electrodes of a gas-discharge laser, comprising:
    a first plurality N of RF-amplifier stages each thereof including first and second transistor amplifier modules in a push-pull arrangement providing an RF amplifier-stage output;
    a power combining arrangement for combining the RF amplifier-stage outputs into a single combined RF output connected to the discharge electrodes;
    a DC power supply having first and second electrical paths therefrom, the first and electrical second paths for supplying a DC voltage to respectively the first and second transistor amplifier modules in each of the RF-amplifier stages;
    the first transistor amplifier modules in each of the RF-amplifier stages being separately connectable to or disconnectable from, the first electrical path from the DC power supply via a corresponding first plurality of electrical switches;
    the second transistor amplifier modules in each of the RF-amplifier stages being separately connectable to or disconnectable from, the second electrical path from the DC power supply via a corresponding second plurality of electrical switches; and first and second current-sensors located in respectively the first electrical path from the DC power supply for monitoring current drawn by any one of transistor amplifier modules when that transistor amplifier module is connected to the corresponding electrical path to the DC power supply.

12. The apparatus of claim 11, an RF signal to be amplified is divided into N first RF-signal portions by a first signal-divider, each of the N RF-signal portions being received by a corresponding one of the N RF-amplifier stages.

13. The apparatus of claim 12 wherein each of the RF-amplifier stages includes a second signal-divider, the second signal divider arranged to divide the first RF-signal portion from the first signal-divider into first and second second-RF-signal portions connected to respectively the first and second transistor amplifier modules.

14. The apparatus of claim 13, wherein there are first and second selectively variable reactance circuits connected to the connection between the second signal divider and respectively the first and second transistor amplifier modules for adjusting the amplitude and phase of the corresponding second signal portion connected to the corresponding transistor amplifier module.

15. The apparatus of claim 14, wherein each of the selectively variable reactance circuits includes a parallel-connected selectively variable capacitor.

16. The apparatus of claim 11, wherein the combined RF output is connected to the discharge electrodes via an impedance matching network.

17. A method of configuring an RF power supply used to supply RF power to the discharge electrodes of a gas discharge laser, said power supply including an RF signal generator, the output of which is supplied to at least three parallel connected amplifier modules, with the output of the amplifier modules being combined and then supplied to the electrodes, said amplifier modules being powered by a DC power supply, the method comprising the steps of:
   (a) disconnecting one or more amplifier modules from the DC power supply so that no more than two amplifier modules are connected to the DC power supply;
   (b) adjusting the output of the amplifier modules that remain connected to the DC power supply so that the current and phase thereof are within predetermined limits; and
   (c) repeating steps (a) and (b) one or more times, each time connecting a different amplifier module or pair of amplifier modules to the DC power supply until the current and phase of the output from all the amplifier modules are within predetermined limits.

18. A method as recited in claim 17 wherein the RF power supply includes a variable impedance unit associated with each of the amplifier modules and wherein said step of adjusting the output of the amplifier modules is performed by adjusting the impedance of the associated variable impedance unit.

19. A method as recited in claim 17 wherein two amplifier modules are connected to the DC power supply during step (b) and wherein during the step of adjusting the amplifier modules, the phase is measured by comparing the phase of the output of two connected amplifier modules.

20. A method as recited in claim 17 wherein only one amplifier module is connected to the DC power supply during step (b) and wherein during the step of adjusting the amplifier modules, the phase is measured by comparing the phase of the output of the signal generator with the phase of the output of the connected amplifier module.

\* \* \* \* \*